United States Patent [19]

Van Haaften

[11] 4,015,422
[45] Apr. 5, 1977

[54] SOLID-STATE ELECTRONIC WATCH ASSEMBLY

[75] Inventor: Egbert Van Haaften, Closter, N.J.

[73] Assignee: Bulova Watch Company, Inc., New York, N.Y.

[22] Filed: June 2, 1975

[21] Appl. No.: 582,924

[52] U.S. Cl. .............................. 58/88 R; 58/23 R; 58/50 R
[51] Int. Cl.² ...................................... G04B 37/00
[58] Field of Search ............ 58/23 R, 23 BA, 50 R, 58/53, 88 R, 88 C

[56] References Cited

UNITED STATES PATENTS

| | | | |
|---|---|---|---|
| 3,756,013 | 9/1973 | Bergey | 58/23 R |
| 3,759,031 | 9/1973 | McCullough | 58/50 R |
| 3,838,568 | 10/1974 | Zurcher | 58/88 C |
| 3,861,135 | 1/1975 | Seeger | 58/50 R |
| 3,863,436 | 2/1975 | Schwartzschild | 58/50 R |
| 3,866,406 | 2/1975 | Roberts | 58/88 R |

Primary Examiner—L. T. Hix
Assistant Examiner—Vit W. Miska

[57] ABSTRACT

A solid-state electronic timekeeping assembly receivable within a watch case and including an electro-optical time display module provided with edge terminals, an integrated circuit module of the same form and provided with corresponding edge terminals, the two modules being positioned in back-to-back relation whereby the edge terminals lie in parallel planes. The modules are interlinked by a flexible printed circuit board, extensions of which are adapted to interconnect the parallel edge terminals of the two modules, the circuit board also functioning to connect the integrated circuit to a quartz-crystal element, power cells and all other discrete elements of the assembly.

8 Claims, 23 Drawing Figures

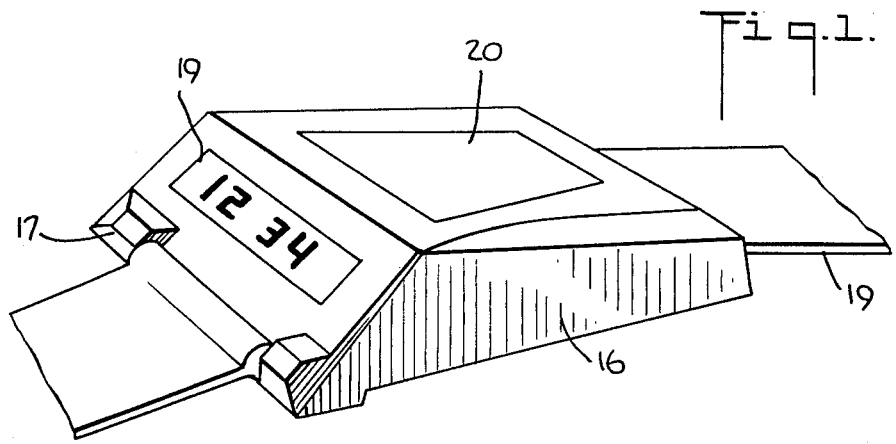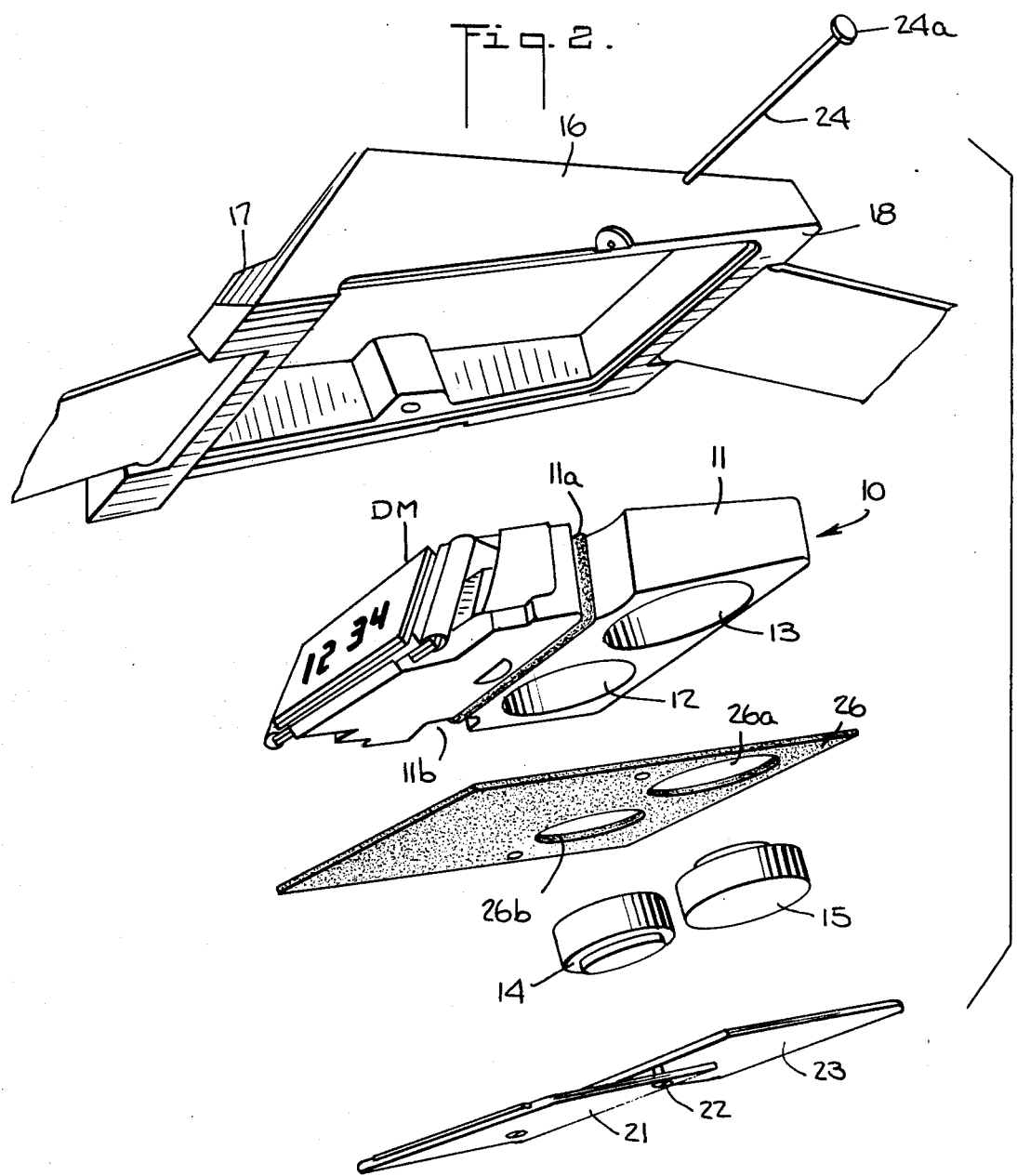

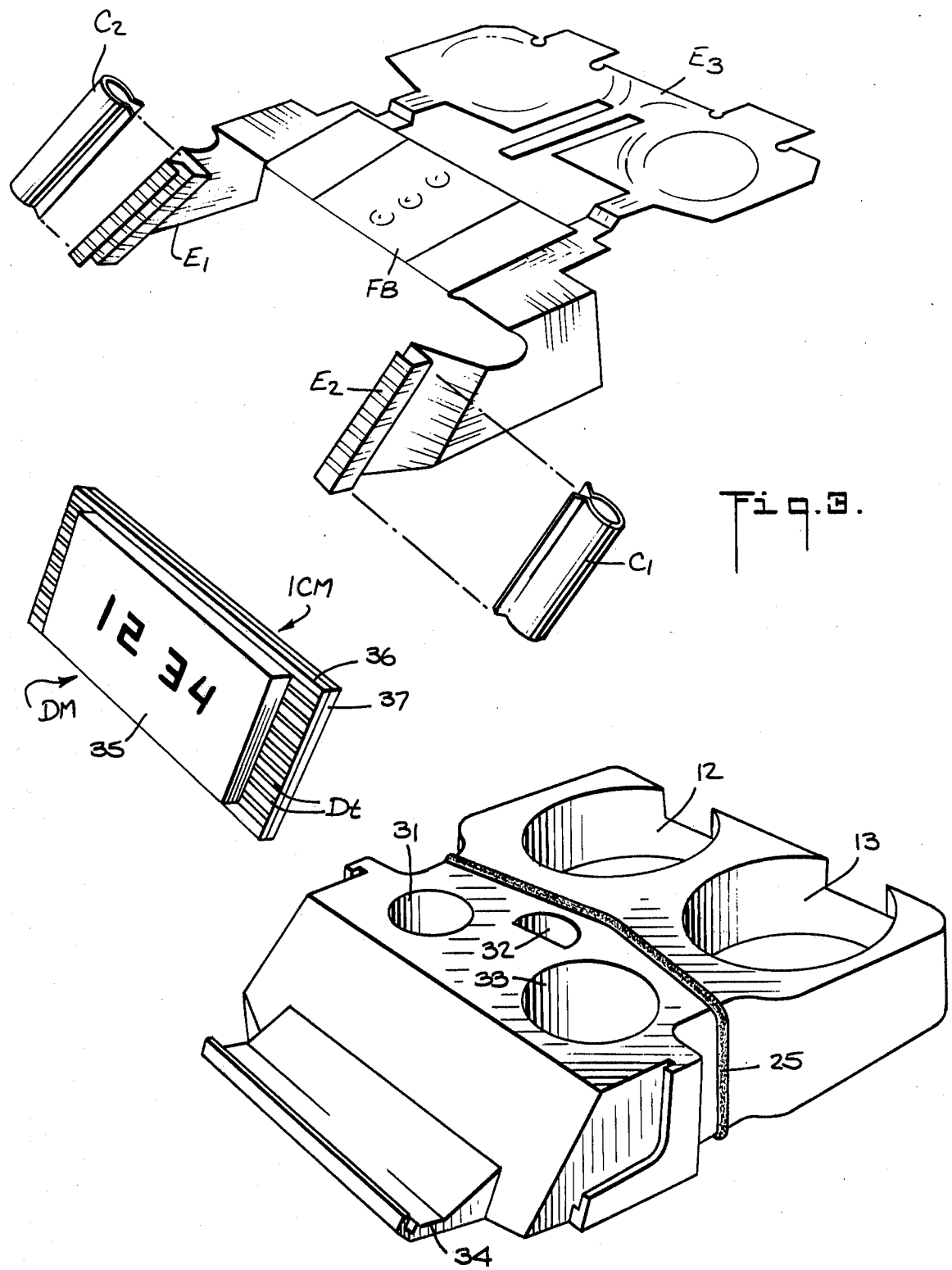

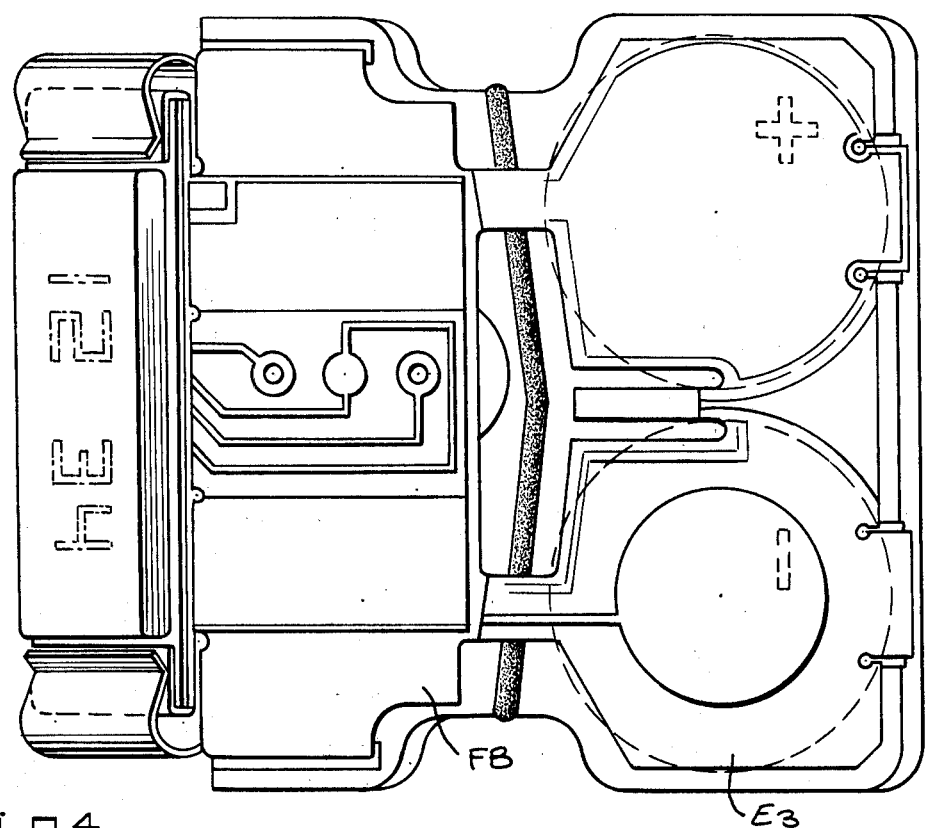
Fig.4.
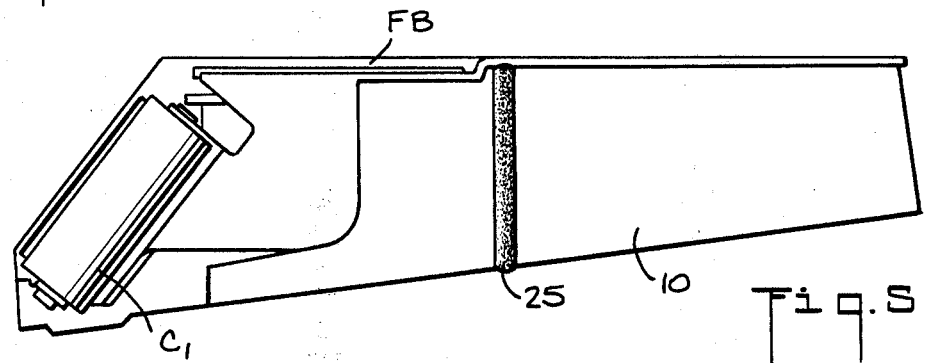
Fig.5.
Fig.6.
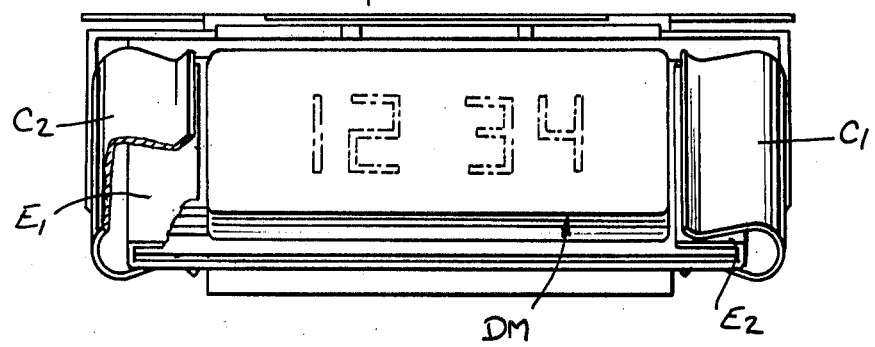

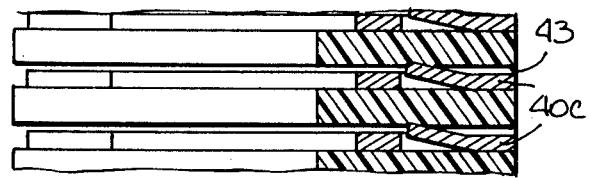
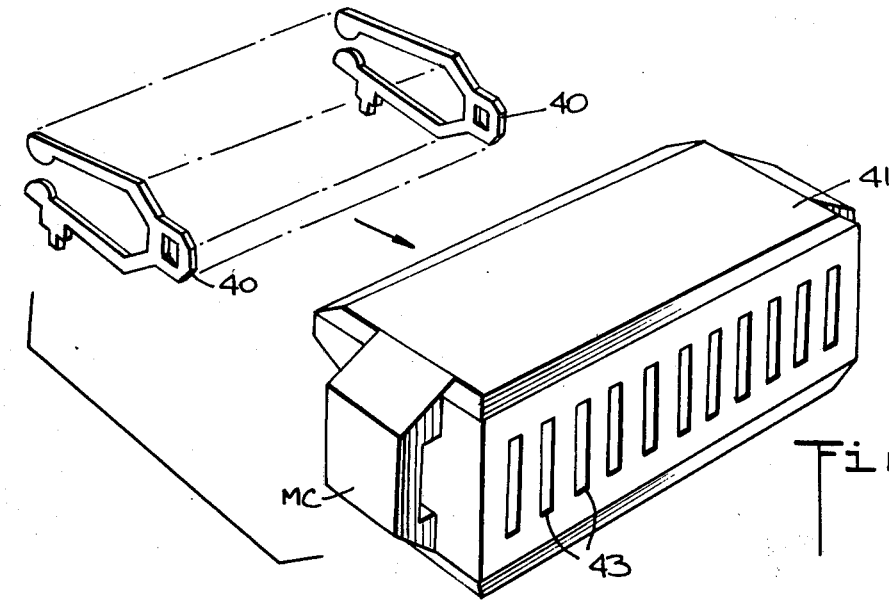
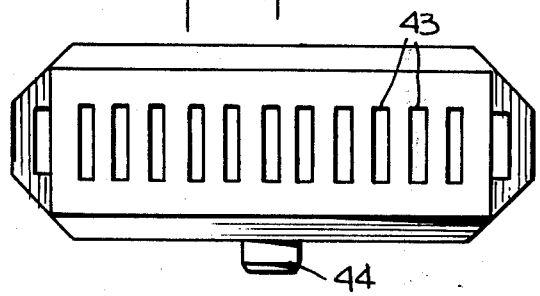
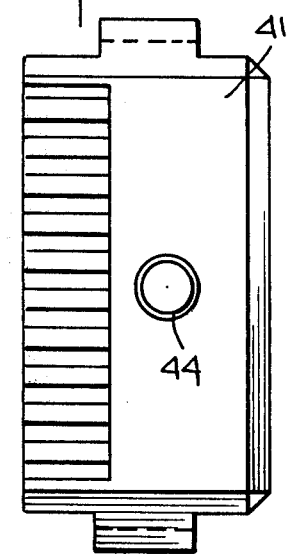
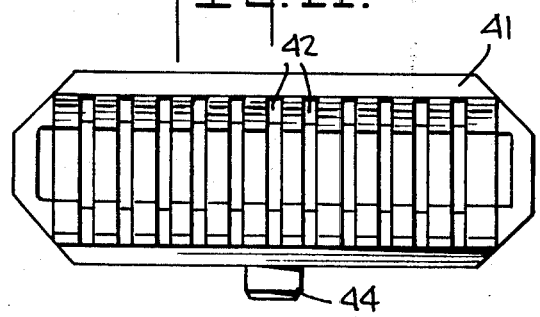

SOLID-STATE ELECTRONIC WATCH ASSEMBLY

BACKGROUND OF INVENTION

This invention relates generally to solid-state electronic watches, and more particularly to a watch assembly in which time display and integrated circuit modules are interlinked by a flexible circuit board which also connects the circuit module to power cells and other discrete elements of the assembly.

The term solid state electronic timepiece or watch, as used herein, is limited to devices provided with an electro-optic time display and having no moving parts. The traditional, spring-powered mechanical watch produces rotary motion for driving gear works that operate the moving hands or time indicators. In those electronic watches which also have a moving hand read-out, the oscillations of a balance wheel or the vibrations of a tuning fork are electronically-sustained. These oscillations or vibrations are converted into rotary motion for driving the gear train; hence such electronic timpieces are not designated solid state watches.

However, in more recently-introduced types of electronic watches such as those disclosed in U.S. Pat. Nos. 3,756,103 and 3,759,031, electrical pulses derived from a crystal-controlled time base serve to actuate a multi-digit electro-optic display formed either by light-emitting diodes (LED) or by liquid-crystal elements (LCD), no moving parts being entailed. In such solid-state watches, the high-frequency output of the time base is fed to a frequency converter constituted by a chain of divider stages. The output of the converter, consisting of low-frequency timing pulses, is applied to a display actuator in the form of a miniature time-computer module that counts the input pulse train, encodes it in binary form and then decodes and processes the results to provide the appropriate activating signals at the display stations.

The power requirements of an LED display are relatively high, and should the display be continuous, the life of the miniature battery would be brief. It is for this reason that commercially-available types of solid-state watches having LED displays are provided with a normally-quiescent display. The display is turned on only when the user depresses a push-button demand switch, thereby conserving power and prolonging the life of the battery. In one such watch, the display is programmed so that upon merely touching the push-button switch, the minutes and hours are indicated for an interval of one and one-quarter seconds, whereas continued depression of the switch causes the minutes and hour data to fade and the seconds to appear and to continue to count as long as the button is held in. In this arrangement, precise computation of time is continuous and independent of whether or not it is displayed, so that the moment the switch is depressed, timing signals are applied to the display. U.S. Pat. Nos. 3,560,990; 3,576,099 and 3,664,118 disclose electronic watches of this type.

Of particular interest in the context of the present invention is U.S. Pat. No. 3,803,827, whose disclosure is incorporated herein by reference. In the solid state watch disclosed in this patent, a crystal-controlled oscillator is coupled through an integrated-circuit frequency divider and display actuator to an LED display. Fitted within the wristwatch case is a one-piece frame which houses the entire wristwatch assembly, including a pair of power cells and an oscillator trimmer capacitor. Ready access may be had to these cells and the trimmer by removal of the watch case back.

While the modular solid state watch construction disclosed in U.S. Pat. No. 3,803,827 facilitates the assembly, adjustment and repair of the movement, and makes it easier to replace the batteries, a large number of leads and other discrete conductors are required to effect connections to terminals of the display package containing the light-emitting diodes forming the display stations and to effect connections to the terminals of the integrated circuit. Thus in putting together a solid state watch of the type disclosed in this patent, it is not simply a matter of fitting modules together within a case, for an elaborate hook-up procedure is involved which adds substantially to the cost of producing such watches.

SUMMARY OF INVENTION

In view of the foregoing, it is the main object of this invention to provide a solid-state electronic watch assembly whose discrete elements may be physically and electrically brought together in a case without the need for wiring operations to complete the assembly, whereby final assembly operations are enormously simplified and repair and maintenance operations are facilitated.

More particularly, it is an object of the invention to provide an assembly of the above-type which includes a unitary, flexible printed-circuit board adapted to interconnect all discrete elements of the assembly.

Also an object of the invention is to provide an assembly for a solid-sate watch having an LED time display in which the display stations are integrated into a chip mounted on a rigid printed circuit board having edge terminals to define a display module, and in which all of the electronic stages necessary to produce timing signals and to activate the dispaly stations are integrated in a chip mounted on a like-printed circuit board to define an integrated circuit module having corresponding edge terminals, the two modules being mounted in back-to-back relation to create a highly compact assembly.

Still another object of the invention is to provide an assembly for a solid-state watch in which an insulating block receivable within the case serves to support or receive the discrete elements of the assembly including the time display and integrated circuit modules, the power cells, the crystal unit and the trimmer, and in which the flexible circuit board is adapted to overlie the block to interlink the various discrete elements. Thus the block functions to physically maintain the discrete elements of the assembly in their proper positions and to prevent displacement thereof under rigorous operating conditions, whereas the flexible circuit board provides all the necessary connections therebetween.

A significant advantage of the invention is that it makes it possible to position the various components of the solid-state watch movement more easily, so that there can be greater variety in the styling of cases designed for the movement.

Briefly stated, these objects are attained in a solid-state electronic watch assembly receivable within a case having an end window, the assembly including a rectangular time display module having edge terminals, a like-shaped integrated circuit module in back-to-back relation with said time display module and having corresponding edge terminals, the two modules resting on a ledge projection from one end of an insulating block at a position in which the time display is viewable through the window.

The block is provided with cavities to accommodate a crystal unit, power cells and other discrete elements, connections between these elements and the modules being effected by a flexible printed circuit board which overlies the block and is provided with extensions which are connected to the edge terminals of the modules, whereby connections are made between the terminals of the time display and terminals of the integrated circuit.

OUTLINE OF THE DRAWINGS

For a better understanding of the invention, as well as other objects and further features thereof, reference is made to the following detailed disclosure to be read in conjunction with the accompanying drawings, wherein:

FIG. 1 is a perspective view of the case of a solid-state electronic watch, which includes one embodiment of an assembly in accordance with the invention;

FIG. 2 is an exploded view of the components of the watch, the assembly being one of these components;

FIG. 3 is an exploded view of the assembly;

FIG. 4 is a plan view of the assembly;

FIG. 5 is a side view of the assembly;

FIG. 6 is a front view of the assembly;

FIG. 12 is a rear view of one of the connector clamps;

FIG. 13 is a bottom view of the connector clamp;

FIG. 14 is a front view of the clamp body;

FIG. 15 is an exploded view of the clamp body and the connectors associated therewith;

FIG. 18 is a section taken in the plane indicated by line 18—18 in FIG. 17;

DESCRIPTION OF INVENTION

Components of the Watch

Figure 7:
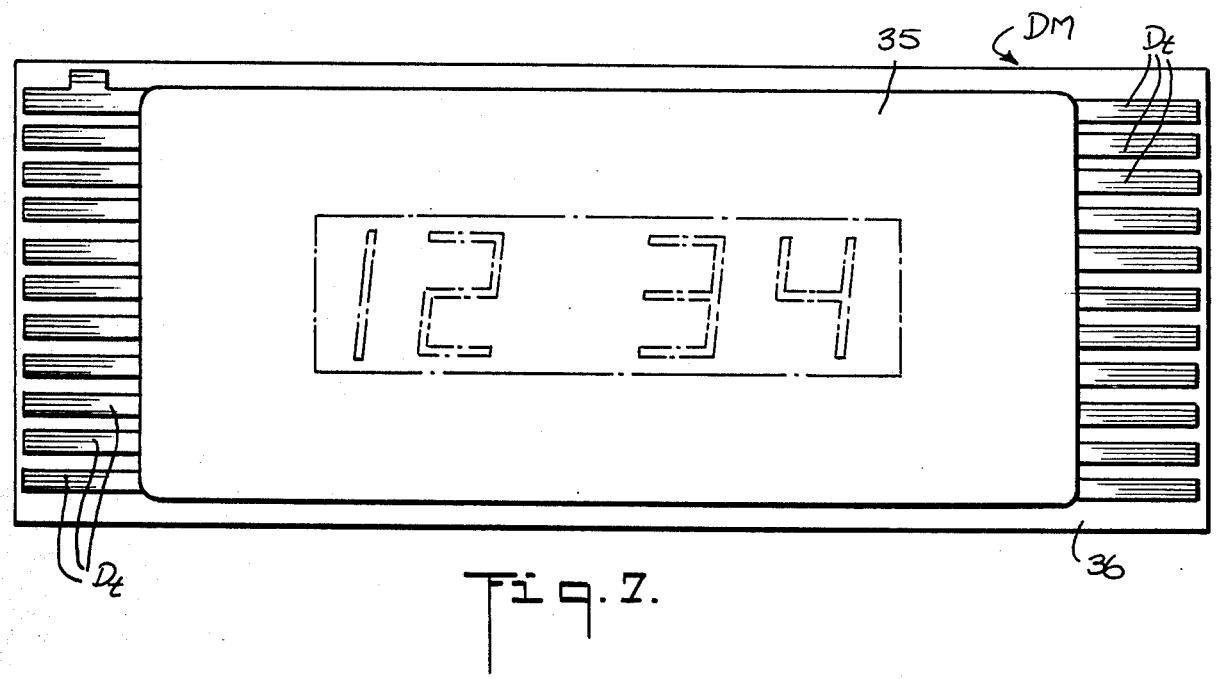
FIG. 7 is a face view of the time display module.

Referring now to FIGS. 1 and 2, there is shown the components of a solid-state electronic watch, one being the assembly, generally designated by numeral 10. The assembly includes an LED time display module DM which is mounted at the sloped front end of an insulating block 11 of a suitable high-strength plastic dielectric material. The block is provided in its rear section with a pair of circular cavities 12 and 13 to accommodate miniature power cells 14 and 15, respectively.

Assembly 10 is received within a case 16 having a generally rectangular configuration, provided at its opposite ends with a pair of lugs 17 and 18 to which the straps of a watch band 19 are attachable in the usual manner. The viewing end of case 16 is sloped to conform to the sloped position of module DM, and cut in this end is a rectangular window 19 behind which is disposed the display stations of module DM.

Top wall 20 of the case is blank and may serve an ornamental purpose, for all timing and calendar information is displayed to the wearer of the watch on the sloped end. The back of the watch is composed of a hatch piece 21 which is secured to the case by a pair of screws 22, and a separate hatch piece 23, which is held in place by a removable pin 24 having a head 22.

Hatch piece 21 covers the forward section of the assembly, which includes the time display module DM and an integrated circuit module to be later described, whereas hatch piece 23 covers the rear section of the assembly, which includes power cells 14 and 15. The line of demarcation between these sections is defined by "O" ring 25, which encircles block 11, the ring lying within opposing arcuate indentations 11a and 11b formed in the block.

Both sections of the case are blanketed by a waterproofing panel 26 of silicone rubber or other elastomeric material. The panel is provided with large circular openings 26a and 26b which register with the battery cavities in assembly block 11. Hatch piece 23 has a wing-shaped contact element (not shown) which defines depressible conductive spring fingers. These fingers, when the hatch piece is in place, press against and electrically engage the end poles of cells 14 and 15, thereby connecting these poles to the metal case which represents ground.

The opposing poles of these cells engage contacts at the bottom of the cavities, which contacts are formed on a flexible printed circuit-board, to be later described serving to connect the cells to the associated electronic circuit and to the LED display module. Thus the watch is powered only when hatch piece 23 is in place to complete the battery circuits.

A more detailed description of the case is contained in the copending application Ser. No. 522,271, filed Nov. 8, 1974 by the same applicant, and entitled "Sectioned Casing for Electronic Watches." As pointed out in the copending application, this case arrangement is advantageous in that its provides access to the power cells through an easily removed hatch piece, making it possible to replace the cells without exposing and disturbing the watch works covered by the other hatch piece.

The Electronic System

Figure 10:
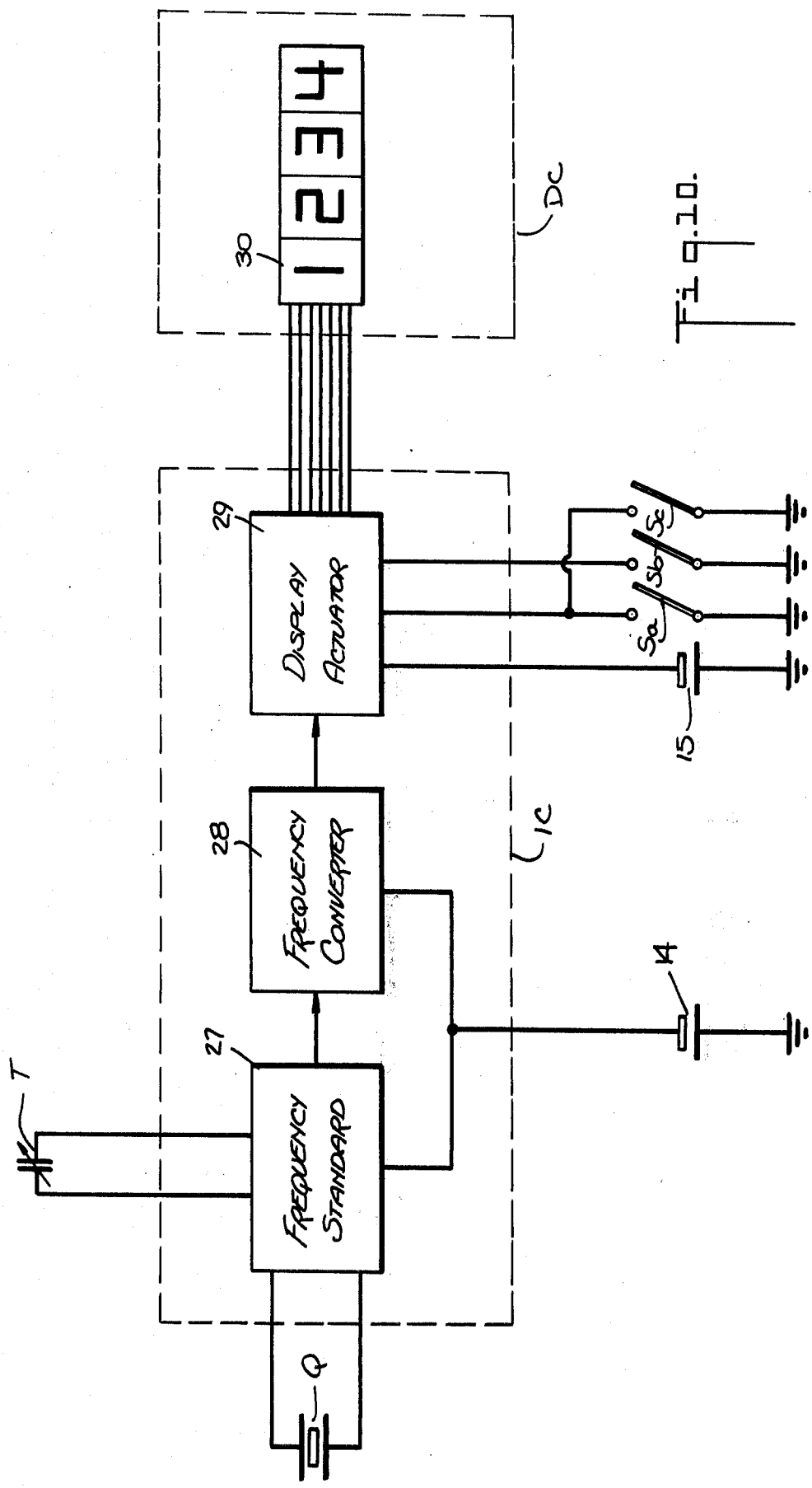
FIG. 10 is a block diagram of the discrete elements which make up the first embodiment of the assembly and the manner in which they are interconnected.

Before considering the structure of the solid state watch assembly in greater depth, the nature of the discrete elements which are included in the assembly and their interconnections will first be analyzed in conjunction with FIG. 10.

The electronic system of the solid state watch comprises a time base or frequency standard 27, constituted by a high-frequency oscillator circuit operating in conjunction with a quartz-crystal resonator unit Q. Fine tuning of the frequency of this oscillator is effected by means of an external trimmer capacitor unit T. The output of time base 27 is supplied to a frequency converter 28 in the form of a multi-stage divider that divides down the frequency from the time base to produce an output signal having a low timing rate, such as a pulse frequency of 1 Hz. This signal is fed to a display actuator 29 constituted by a suitable logic circuit which controls a four-station time display, generally designated by numeral 30, making use of light-emitting diodes (LED's).

Time base 27 (except for the associated crystal unit Q and trimmer unit T), frequency converter 28 and display actuator 29 are all integrated into a unitary, integrated circuit chip IC. The four station LED display 30 is integrated into a display chip DC. Each of these chips, as will later be explained, is mounted on a rigid printed circuit board having edge terminals to form separate circuit and display modules. Since the terminals on the display module must be connected to corresponding terminals on the integrated circuit module, one important aspect of the invention resides in the manner in which these connections are made without the need for hook-up or wiring operations.

Frequency standard 27 and frequency converter 28 are both energized by the first replaceable battery cell 14, while the display actuator 29 and the LED dispaly 30 are energized by the second replaceable battery 15 under the control of switches $S_a$, $S_b$ and $S_c$.

Switches $S_a$ and $S_b$ are button-operated, the buttons projecting from the watch case so that these switches may be manually depressed, whereas switch $S_c$, which is in parallel with switch $S_a$, is an inertial switch that is incorporated in the watch case and is actuated only when the wearer of the watch moves the wrist on which the watch is carried in a prescribed manner.

In normal operation, time is continuously being kept by the system but is not presented by the LED display. That is to say, no time indication is visible, this being the normal condition which prevails in order to conserve the power of the battery. However, even though the time is not displayed, the system continues to keep accurate time and is capable of displaying the time or calendar date at any instant when the switches are actuated.

The arrangement is such that when push-button switch $S_a$ is pressed, the hour and minute or time-of-day reading is presented by all four stations of the display, such as "12:34" shown in FIG. 10. When button switch $S_b$ is pressed, the day of the month is given at the third and fourth display stations of the display, say "29." But when button switches $S_a$ and $S_b$ are simultaneously pressed, then the time in seconds is presented at the third and fourth stations, say "59." Reset functions are carried out by a separate button (not shown).

Thus the display selectively provides both time and calendar indications. A similar display arrangement involving the use of two button switches is disclosed in U.S. Pat. No. 3,846,971, whose disclosure is incorporated herein by reference.

Switch $S_c$, which is shunted across switch $S_a$, is inertially-operated, preferably in the manner disclosed in applicant's copending application Ser. No. 499,015, filed Aug. 20, 1974, entitled "Arm-Actuated Switch for Solid State Electronic Watch," such that when the arm of the wearer is moved in a predetermined manner, the inertial switch is closed to provide a time-of-day reading. The advantage of this switch is that it makes it unnecessary for the wearer of the watch to use his other hand to press the manually-operated switch $S_a$, for this is often inconvenient.

It is to be understood, however, that the present invention is not limited to watches having particular types of time and calendar readings and externally-operated switches to activate these readings, for regardless of the number of stations in the display and the nature of the associated operating switches, the solid-state electronic watch will still include an electro-optic display, an electronic circuit for generating the necessary timing signals for the display and power cells, all of which must be cooperatively housed within the watch case. The purpose of the present invention is to provide a highly compact assembly in which the discrete elements which constitute the electronic system are securely and protectively mounted at their proper positions within the case and are interconnected with each other so that this watch operates efficiently and reliably.

The Assembly

Referring now to FIG. 3, there is shown an exploded view of the assembly, the components of which include insulating block 11 and time display module DM, already described in connection with FIG. 1.

Block 11, in addition to cavities 12 and 13 for accommodating power cells 14 and 15 (FIG. 1) in the rear section thereof, is provided in its front section with a cavity 31 for receiving trimmer capacitor T, a cavity 32 for nesting quartz-crystal unit Q, and a cavity 33 for receiving inertial switch $S_c$, these discrete elements being shown in FIg. 10.

Block 11 includes a projecting front ledge 34 to support both module DM and an integrated circuit module ICM, which includes integrated circuit chip IC (shown in FIG. 10), that integrates all of the circuits associated with the display module.

As shown separately in FIG. 7, display module DM is formed by a package or chip 35 which incorporates the four LED stations, the chip being mounted on a rigid printed circuit board 36 of rectangular form, on whose face at either edge is a parallel array of edge terminals $D_t$ for the various LED segments at the four stations.

It will be noted that there are eleven terminals $D_t$ at either edge of the display module, affording a total of 22 drive inputs. In order to form selectively the numerals 0 to 9 at an individual LED station, seven segments are required. When all segments are activated, the number 8 is formed. But the first LED station requires only a single long vertical line to represent the numeral 1, for in a time-of-day display the first station is either blank or 1, whereas the second station must present 0 to 9, so that in combination with the first station, the hours 1 to 12 may be selectively presented. Hence while seven terminals are necessary for each of the seven segments forming the second, third and fourth stations, giving a total of twenty-one for these stations, only a single terminal is needed for the first station, which accounts for the twenty-two terminals on the module DM. Obviously, if the display includes more than four stations, a greater number of terminals are required.

In practice, not all twenty-two terminals need be used, for some of the segments at the stations may be tied together, as a result of which only thirteen terminals are actually used and the rest are dummies whose sole function is to assist in lining up the flexible board.

Figure 8:
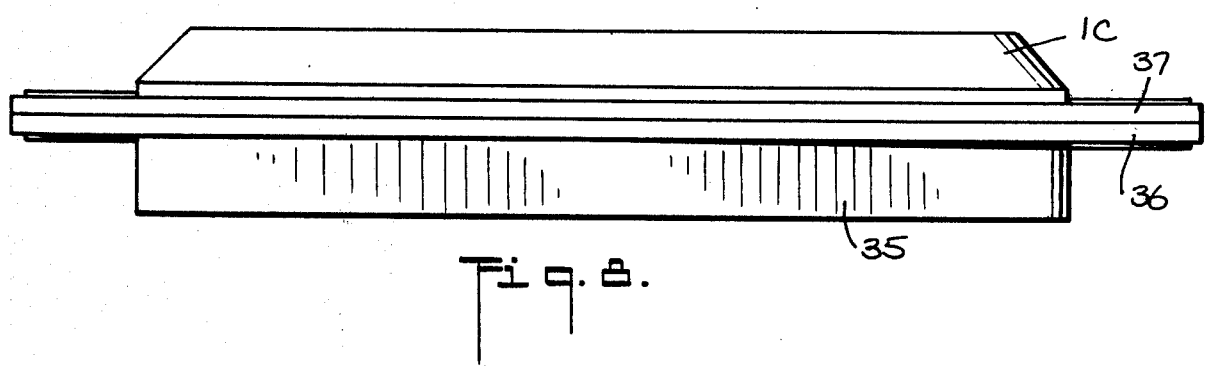
FIG. 8 is a side view of the display module in back-to-back relation to the integrated circuit module.
Figure 9:
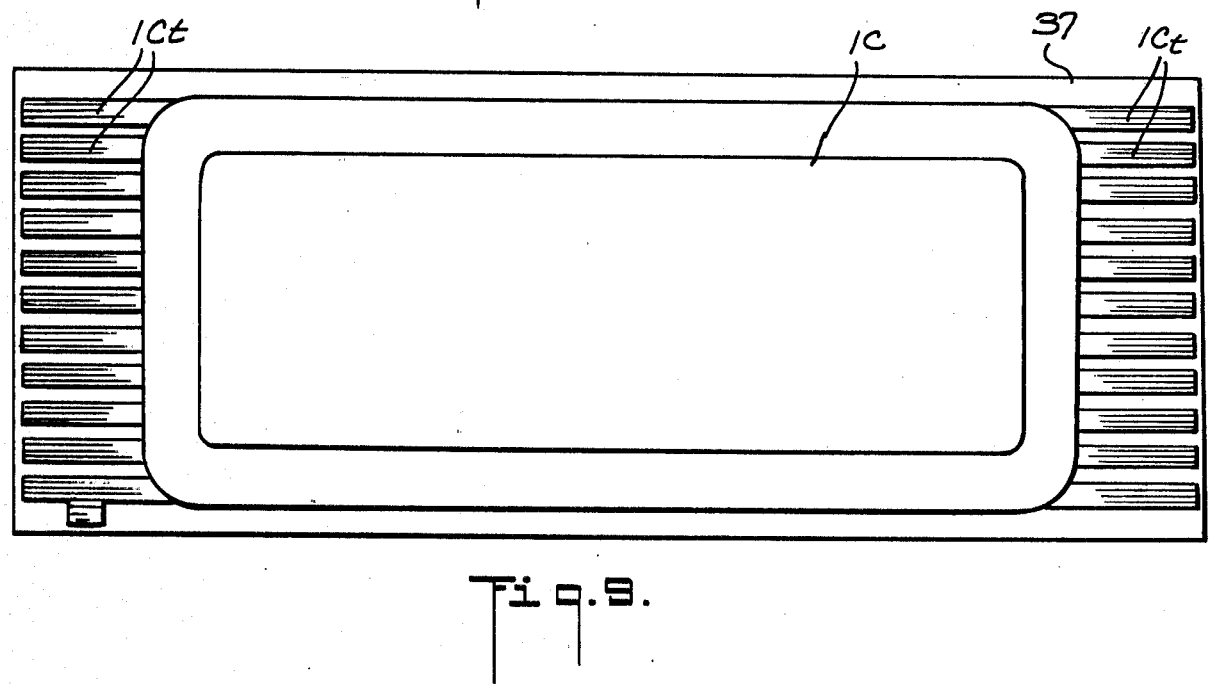
FIG. 9 is a face view of the integrated circuit module.

Integrated circuit module ICM, shown separately in FIG. 9, is formed by chip IC, which is mounted on a printed circuit board 37 identical to board 36 of module DM. Board 27 is provided with edge terminals $IC_t$, which correspond with terminals $D_t$ on the module DM. The two modules are positioned, as shown in FIG. 8, in back-to-back relation, so that while the corresponding terminals on the modules are registered in parallel planes, they are disconnected from each other. It is, of course, necessary to interlink these terminals in order to apply the drive signals produced in the IC chip to the appropriate segments of the display.

The electrical linkage between the two modules are the essential connections from the integrated circuit to the discrete elements held in block 10 and are effected by a flexible printed circuit board FB, shown separately in FIG. 3. The board is fabricated by laminating a metal foil formed of copper or other highly-conductive material, to a substrate of synthetic plastic film material such as Mylar. The copper is coated with a photoresist material which is thereafter etched to define the desired pattern of conductive lines and zones.

Flexible circuit board FB includes conductive zones for connection to the discrete element (trimmer T, crystal unit Q and inertial switch $S_c$) contained in cavities 31, 32 and 33 in the front section of the block, the board overlying the block, as best seen in FIG. 4.

Circuit board FB is also provided with forward extensions $E_1$ and $E_2$, which are creased to wrap around the respective abutting ends of circuit boards 36 and 37 of modules DM and ICM. The extensions each have a parallel array of conductive lines thereon which match edge terminals $D_t$ on Module DM and edge terminals $IC_t$ on module ICM.

Hence extensions $E_1$ and $E_2$ serve to electrically interlink the corresponding edge terminals on the modules. To insure effective contact between the conductors on the circuit board extensions and the edge terminals, clips $C_1$ and $C_2$ are provided, which are adapted to clamp over the wrapped-about abutting ends of the modules. Thus in the assembly operation, the modules are first placd in back-to-back relation on the block, extensions $E_1$ and $E_2$ are wrapped about the ends of the modules, and then the clips are attached thereto.

Flexible printed circuit board FB is also provided with a rear extension $E_3$ which, as best seen in FIG. 4, includes a conductive zone $Z_1$ for contact with the negative pole of cell 15 and a conductive zone $Z_2$ for contact with the positive pole of cell 14 in the block cavities therebelow.

Circuit board FB is also provided with forward extensions $E_1$ and $E_2$, which are creased to wrap around the respective abutting ends of circuit boards 36 and 37 of modules DM and ICM. The extensions each have a parallel array of conductive lines thereon which match edge terminals $D_t$ on module DM and edge terminals $IC_t$ on module ICM.

Hence extensions $E_1$ and $E_2$ serve to electrically interlink the corresponding edge terminals on the modules. To insure effective contact between the conductors on the circuit board extensions and the edge terminals, clips $C_1$ and $C_2$ are provided, which are adapted to clamp over the wrapped-about abutting ends of the modules. Thus in the assembly operation, the modules are first placed in back-to-back relation on the block, extensions $E_1$ and $E_2$ are wrapped about the ends of the modules, and then the clips are attached thereto.

Flexible printed circuit board FB is also provided with a rear extension $E_3$ which, as best seen in FIG. 4, includes a conductive zone $Z_1$ for contact with the negative pole of cell 15 and a conductive zone $Z_2$ for contact with the positive pole of cell 14 in the block cavities therebelow.

Thus in putting together the assembly, no wiring operations are required, yet all of the discrete elements which constitute the assembly are properly connected together.

Second Assembly

In the first assembly shown in FIG. 3, the flexible circuit board extensions $E_1$ and $E_2$ are creased to wrap around the abutting ends of the circuit boards of modules DM and ICM in order to interconnect the corresponding edge terminals on the modules as well as to connect the integrated circuit to the discrete elements of the assembly.

In order to insure good electrical contact between the edge terminals on the modules and the conductive lines on the flexible circuit board in the first assembly, a pair of clips $C_1$ and $C_2$ are provided, which clamp over the wrapped-about abutting ends of the modules. The effectiveness of this arrangement depends in good part on the care exercised in creasing the flexible circuit board extensions so that the conductive lines thereon exactly register with the edge terminals on the modules DM and ICM. In practice, this is somewhat difficult to accomplish, for the extensions are formed of flexible material.

Figure 11:
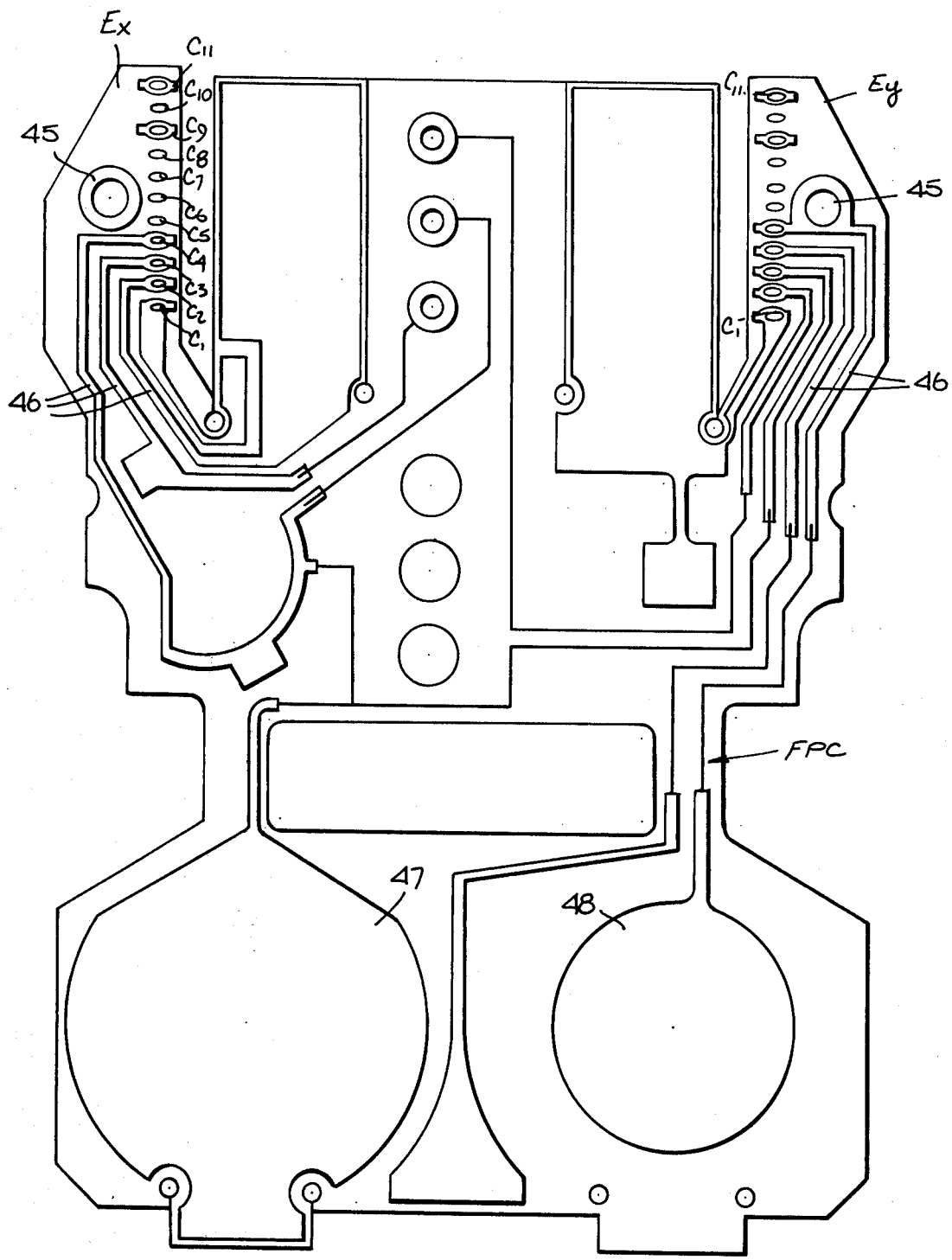
FIG. 11 is a plan view of the flexible circuit board of a second embodiment of an assembly in accordance with the invention.

The second assembly illustrated in FIGS. 11 to 23 is identical to the first assembly shown in FIG. 3 and it includes block 11, time display module DM and integrated circuit module ICM, but the flexible printed circuit board shown in FIG. 11 and represented by FPC differs from that in the first assembly. Moreover, flexible board FPC is associated with a pair of multiconnector clamps MC, as shown in FIG. 22.

Figure 16:
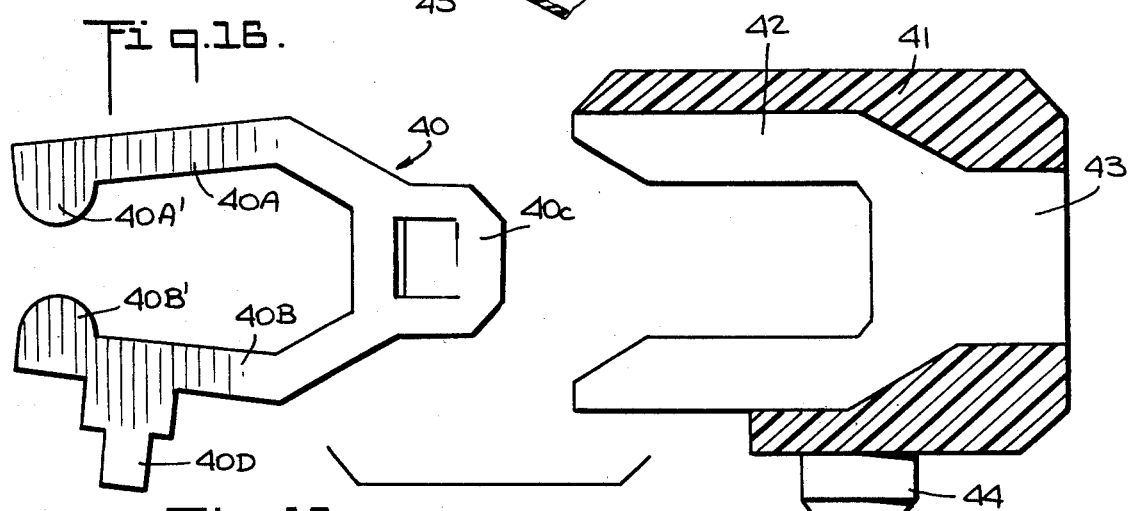
FIG. 16 is a transverse section taken through the body of the clamp, and it also separately illustrates the connector associated therewith.
Figure 17:
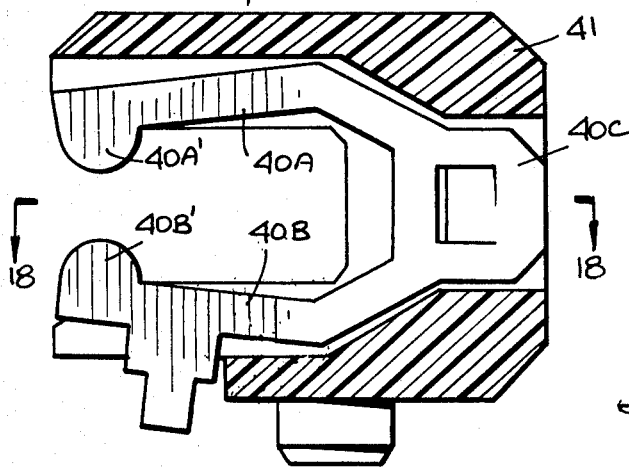
FIG. 17 is a transverse section taken through the connector clamp, showing one connector.
Figure 20:
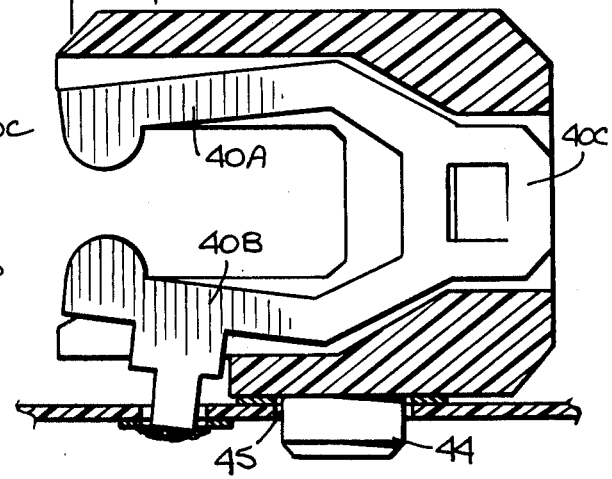
FIG. 20 is a transverse section taken through the connector clamp.
Figure 23:
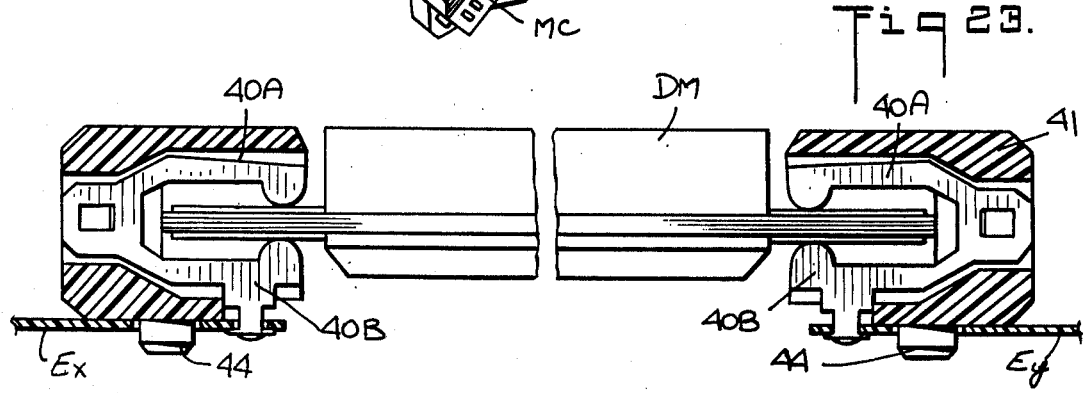
FIG. 23 is a section showing the relationship between the clamps and the modules clamped thereby.

In the second assembly, to insure a positive and accurate interlinkage of the edge terminals on modules DM and ICM, the multi-connector clamps MC are provided with an array of horseshoe-shaped connectors 40 as shown in FIG. 15. One such connector is shown in FIG. 16, the connector being formed of beryllium copper or other suitable resilient metallic material. The connector includes a pair of flexible tines 40A and 40B having rounded noses 40A' and 40B' adapted to engage and electrically shunt a pair of corresponding edge terminals of the modules sandwiched between the connector, as illustrated in FIG. 23.

Each connector is also provided at its base with a tongue 40C which serves to anchor the connector in the insulating body 41 of the clamp, and a tab 40D extending laterally from tine 40A, the tab serving as a connector terminal. Insulating body 41 is preferably made of Lexan or any other high-strength plastic material having good dielectric properties.

Figure 19:
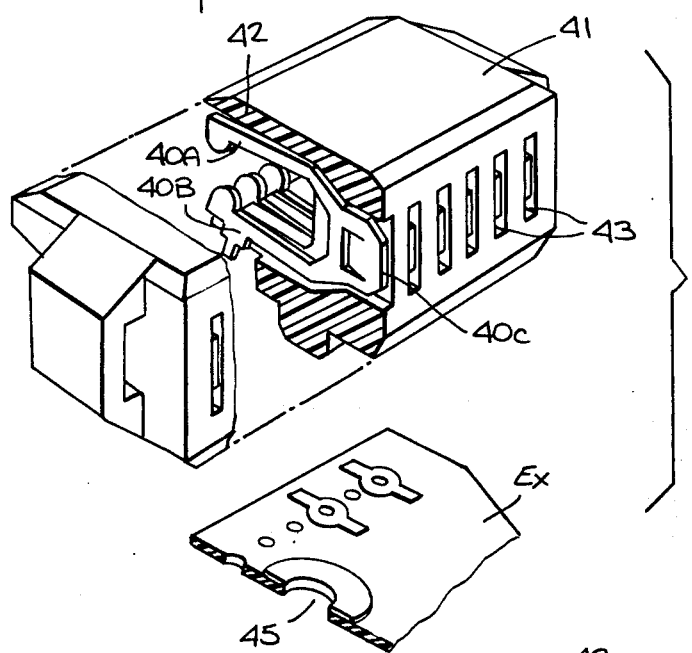
FIG. 19 is a perspective view of the clamp which is partly cut away to expose the connectors within the clamp body.

Body 41 of the clamp is provided along its inner walls, as best seen in FIGS. 14 and 19, with an array of horseshoe-shaped slots 42 adapted to accommodate the array of connectors 40, the rear of the clamp body having a row of rectangular openings 43 therein to receive the tongues 40C of the connectors. Body 41 also includes a projecting pin 44 for locating the body on the associated flexible printed circuit board FPC.

Figure 21:
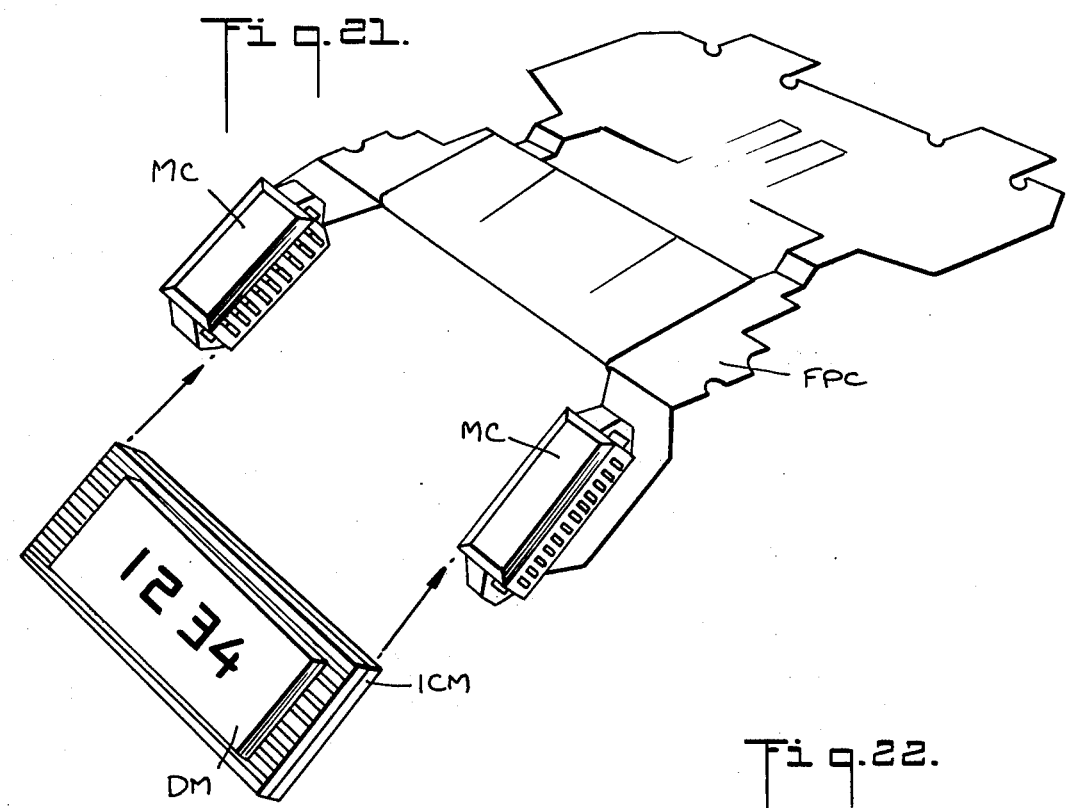
FIG. 21 shows the relationship between the printed circuit board, the clamps coupled thereto and the display and integrated circuit modules.
Figure 22:
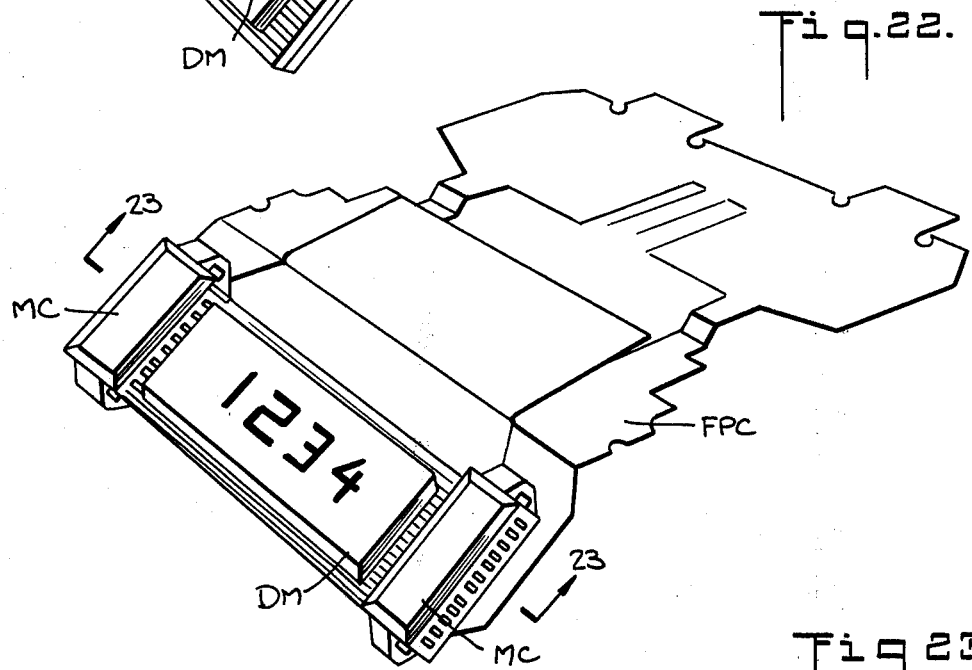
FIG. 22 is the same as FIG. 21 except that the modules are clamped to the board.

The flexible printed circuit board FPC, as shown in FIGS. 11, 21 and 22, includes a pair of extensions $E_x$ and $E_y$, each having formed thereon a row of eleven contacts $C_1$ to $C_{11}$, which are soldered to the connector terminal tabs 40D of the associated clamp MC. Each extension also has a round opening 45 to accommodate the locating pin 44 projecting from the clamp body.

Conductive lines 46 on the flexible printed circuit board FPC connect selected contacts to the discrete elements of the assembly, including the battery cells to which contact is made by printed conductive zones 47 and 48.

Thus the second assembly is essentially the same as the first assembly, but for the fact that the flexible printed circuit board extensions, instead of making direct contact with the edge terminals of the modules, are provided with multi-connector clamps which serve to clamp the modules together and to electrically shunt the edge terminals of the modules so that each edge terminal on the display module DM is connected to the corresponding edge terminal of the integrated circuit module ICM.

While there have been shown and described preferred embodiments of a solid-state electronic watch assembly in accordance with the invention, it will be appreciated that many changes and modifications may be made therein without, however, departing from the essential spirit thereof.

I claim:

1. In a solid state electronic watch provided with a generally rectangular case having a window formed on one end thereof, and an assembly receivable within said case, said assembly comprising:
   A. an insulating block having a ledge projecting from the forward section thereof adjacent said one end of the case, said block having cavities therein to accommodate discrete elements, including a cavity in the rear section of the block to receive a battery cell,
   B. an electro-optic display module formed by a chip constituted by a group of digital display stations mounted on a rectangular board on whose fact at either edge thereof is an array of terminals for applying drive signals to the stations;
   C. an integrated electronic circuit module formed by an integrated circuit chip mounted on a like board on whose face at either edge thereof is an array of corresponding terminals, said integrated electronic circuit being constituted by a high-frequency standard whose output is applied to a divider to produce low-frequency timing pulses and a display actuator responsive to said pulses, said frequency standard being constituted by an oscillator operating in conjunction with a quartz crystal unit, which is one of the discrete elements received in one of said cavities, said electronic circuit, when energized, functioning to generate said drive signals, said modules being mounted in back-to-back relation on said ledge, with the display stations exposed to view through the window of said case, and
   D. a flexible printed circuit board overlying said block for electrically interlinking interlinking the terminals of the modules and connecting the integrated electronic circuit to discrete elements held in the cavities of the block, said flexible board including a pair of extensions having an array of conductive lines, and means connected to some of said lines to engage and interconnect the edge terminals of said modules, said means being constituted by a pair of multi-connector clamps, each clamp being formed by a pair of flexible tines which are adapted to engage and electrically shunt a pair of corresponding edge terminals of said modules.

2. A watch as set forth in claim 1, wherein said case has a back formed by a first hatch piece covering the forward section of the block, and a second, separately removable, hatch piece covering the rear section of the block.

3. A watch as set forth in claim 1, wherein said oscillator further operates in conjunction with a trimmer capacitor, which is another of the discrete elements received in another of said block cavities.

4. An assembly as set forth in claim 1, wherein said extensions are each provided with a row of contacts and said connectors have terminals attached to said contacts.

5. A watch as set forth in claim 2, wherein said display stations are formed by light-emitting diodes.

6. An assembly as set forth in claim 4, wherein each clamp is provided with a U-shaped body formed of insulating material, the internal walls of which are slotted to receive said connectors.

7. An assembly as set forth in claim 6, wherein each connector includes a tongue extending from the base thereof, and said body includes an opening to accommodate said tongue.

8. An assembly as set forth in claim 7, wherein said connector is formed of beryllium copper.

* * * * *